(12) United States Patent
Riggsby et al.

(10) Patent No.: US 8,081,427 B2
(45) Date of Patent: Dec. 20, 2011

(54) SIGNAL AMPLIFIERS HAVING PLATED ALUMINUM HOUSING BODIES WITH A BACK PLATE PERMANENTLY ATTACHED THERETO

(75) Inventors: Robert Ryan Riggsby, Hickory, NC (US); Neil Phillips, Dove Canyon, CA (US)

(73) Assignee: CommScope, Inc. of North Carolina, Hickory, NC (US)

( * ) Notice: Subject to any disclaimer, the term of this patent is extended or adjusted under 35 U.S.C. 154(b) by 196 days.

(21) Appl. No.: 12/533,265

(22) Filed: Jul. 31, 2009

(65) Prior Publication Data

US 2011/0026194 A1 Feb. 3, 2011

(51) Int. Cl.
*G06F 1/16* (2006.01)
(52) U.S. Cl. .................. 361/679.01; 439/638; 348/723; 250/269.6
(58) Field of Classification Search .................. 439/579, 439/638, 550, 535, 271, 577; 361/697, 725, 361/679.01, 679.35, 679.06; 250/370, 370.09, 250/269.6; 348/512, 723, 207.1; 381/120, 381/87, 86, 345; 73/721, 727
See application file for complete search history.

(56) References Cited

U.S. PATENT DOCUMENTS

| | | | | |
|---|---|---|---|---|
| 6,969,278 | B2 * | 11/2005 | Shapson | 439/579 |
| 2004/0209521 | A1 * | 10/2004 | Cooper et al. | 439/638 |
| 2007/0222538 | A1 * | 9/2007 | Ornt et al. | 333/105 |

OTHER PUBLICATIONS

Pictures of prior art signal amplifier having a two piece aluminum housing (admitted prior art).
Internet article title Cu coated Aluminum has Galvanic Corrosion Problems, dated Jun. 8, 2009, http://www.finishing.com/1200-1399/1290.shtml (admitted prior art).
Internet advertisements for CATV Zinc Housing Amplifier Module with water-resistant function, 10 dB Forward Gain offered by Jiaxing Lonver Electronics Co. Ltd, dated Jul. 30, 2009, http://lonver-lec.manufacturer.globalsources.com/si/6008824920238/LargeImage/CATV-Z, http://lonver-lec.manufacturer.globalsources.com/si/6008824920238/pdtl/CATV-amplifier . . . (admitted prior art).
Internet advertisements for CATV Subscriber Amplifier (MLRDA 1010N) having a zinc alloy dies cast, zinc-plated HQ housing, dated Jul. 30, 2009, http://www.made-in-china.com/showroom/jim-mykim8010/product-detailtqBExTHVmGR . . . (admitted prior art).
Abstract for article titled Pretreatment for Plating on Aluminum Using the Stannate Process by J.C. Jongkind, Aluminum Assoc., pp. 539-549, 1982.

* cited by examiner

*Primary Examiner* — Hung Duong
(74) *Attorney, Agent, or Firm* — Myers Bigel Sibley & Sajovec (57) ABSTRACT

Signal amplifiers are provided that have a two (or more) piece housing that has an input port, an output port and a power port. At least one of the housing pieces comprises an aluminum housing piece. A first coaxial connector is mounted in the input port, a second coaxial connector is mounted in the output port and a third coaxial connector is mounted in the power port. A power amplifier is mounted within the housing, and is configured to amplify an input signal received through the first coaxial connector. At least first and second of the housing pieces have at least one metal plated thereon, and the first housing piece is soldered, welded or brazed to the second housing piece.

16 Claims, 5 Drawing Sheets

SIGNAL AMPLIFIERS HAVING PLATED ALUMINUM HOUSING BODIES WITH A BACK PLATE PERMANENTLY ATTACHED THERETO

FIELD OF THE INVENTION

The present invention relates to signal amplifiers and, more particularly, to signal amplifiers having aluminum housing bodies.

BACKGROUND

Cable television networks are communications networks that are used to transmit cable television signals, broadband Internet service, video-on-demand services, digital telephone service and/or a variety of other information between one or more service providers (e.g., a cable television company) and a plurality of subscribers (e.g., individual homes, apartments, hotels, businesses, etc.). Most conventional cable television networks comprise hybrid fiber-coaxial networks. In these networks, fiber optic cables are typically used to carry radio frequency ("RF") signals between the headend facilities of the service provider and various distribution points, while less expensive coaxial cable may be used, for example, to carry the signals between the distribution points and individual homes and businesses.

The RF signal received from the service provider at each subscriber premise may be a relatively low power signal (e.g., 5 dBmV/channel) that may require amplification in order to properly service the various communication ports maintained by a subscriber. As such, an RF signal amplifier is typically provided at each subscriber premise that is used to amplify the signals received from the service provider. In some cases, the RF signal amplifier may also amplify return signals that are passed from the subscriber premises to the service provider. In many cases, these signal amplifiers may be mounted outdoors, and hence can be subject to extreme environmental conditions.

Figure 7:
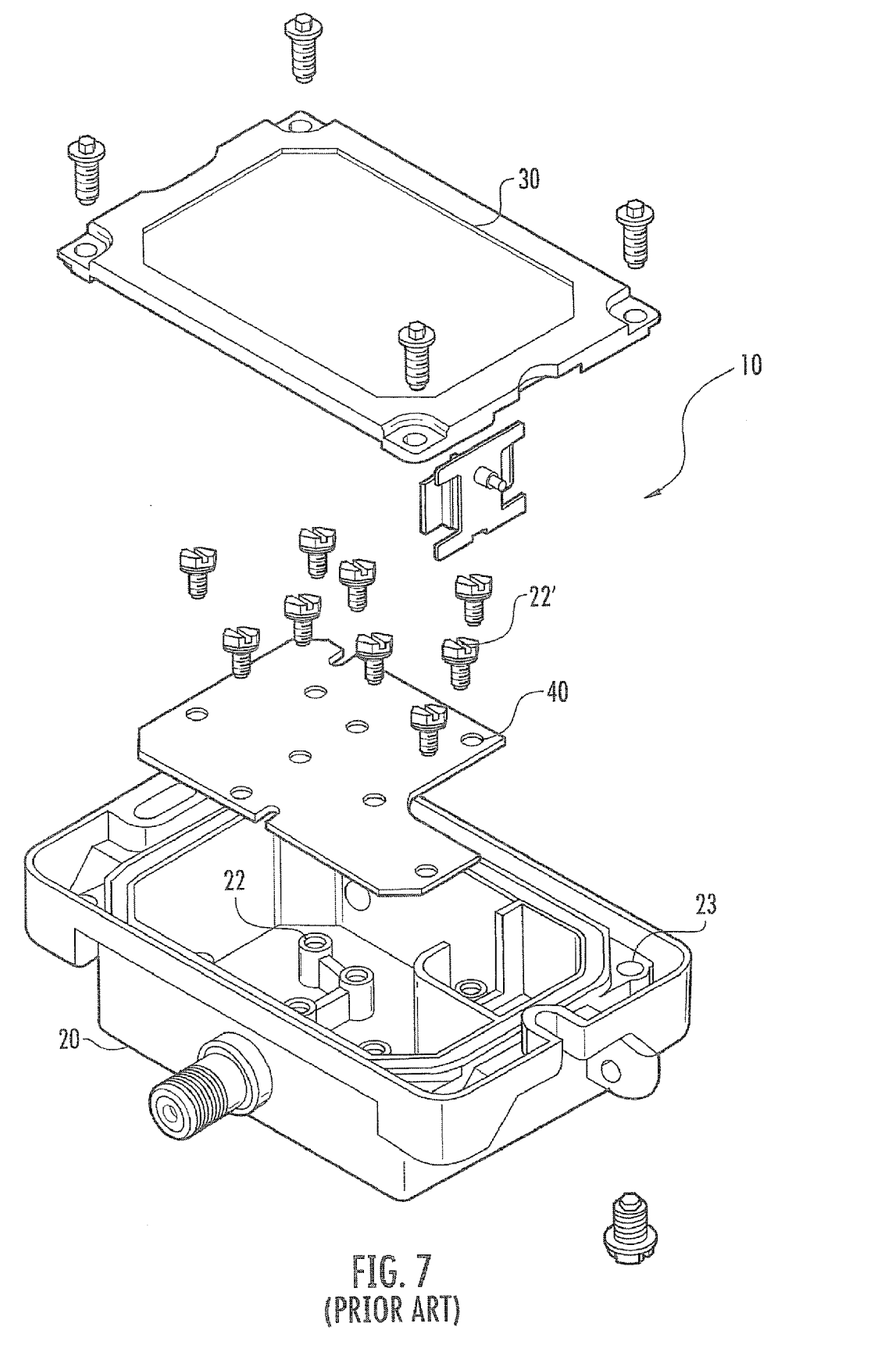
FIG. 7 is an exploded perspective view of a conventional signal amplifier having an aluminum housing.
Figure 8:
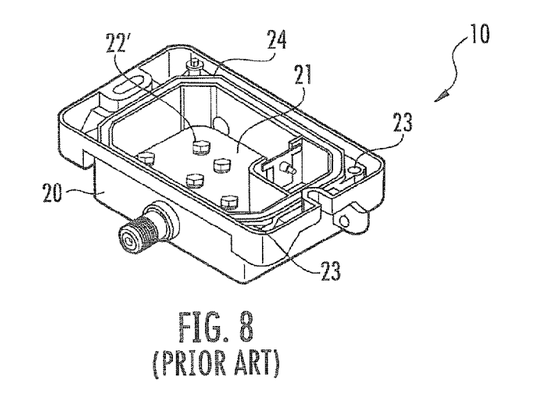
FIG. 8 is a perspective view of the housing body of FIG. 7 with the amplifier circuitry mounted therein.
Figure 9:
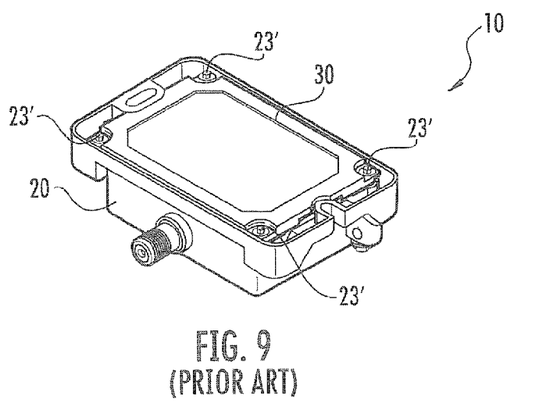
FIG. 9 is a perspective bottom view of the conventional signal amplifier of FIG. 7 in fully assembled form.
Figure 10:
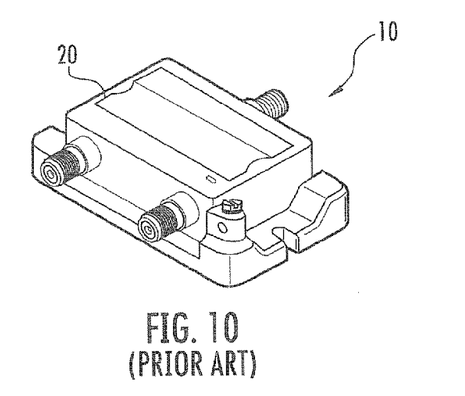
FIG. 10 is a perspective top view of the conventional signal amplifier of FIG. 7 in fully assembled form.

Signal amplifiers are known in the art that include two-piece aluminum housings comprising a housing body and a back plate. FIGS. 7-10 depict a conventional signal amplifier 10 having an aluminum housing that includes a housing body 20 and a back plate 30. In particular, FIG. 7 is an exploded perspective view of the conventional signal amplifier 10, FIG. 8 is a perspective view of the housing body 20 with amplifier circuitry mounted therein, and FIGS. 9 and 10 are bottom and top perspective views, respectively, of the signal amplifier 10 in fully assembled form.

As shown in FIGS. 7-10, the housing body 20 comprises an open-topped box that has an interior compartment 21. The bottom surface of the compartment 20 includes a plurality of fixed, internally threaded nuts 22 that receive screws 22' that are used to hold the internal circuitry 40 of the signal amplifier (shown simply as a printed circuit board to simplify the figures) in place in the compartment 21. Four apertures 23 are included about the periphery of the housing body 20 that receive locking screws 23' that are used to mount the back plate 30 to the housing body 20. A channel 24 extends around the upper periphery of the compartment 21. This channel is configured to receive a rubber or plastic gasket 24 that is inserted between the housing body 20 and the back plate 30 to provide a weather-resistant seal between the housing body 20 and the back plate 30. Additionally, a second gasket formed of a conductive material is also typically interposed between the housing body 20 and the back plate 30 to reduce radio frequency interference ("RFI").

Signal amplifiers are also known in the art that include a two-piece zinc housing comprising a housing body and a back plate. The zinc housing pieces may be plated with other metals, so that the back plate may be soldered to the housing body. This may allow elimination of the weather gasket, RFI gasket and the locking screws.

SUMMARY

Pursuant to embodiments of the present invention, RF signal amplifiers are provided that have a housing that includes a first aluminum housing piece and a second housing piece. The housing also includes an input port, an output port and a power port. A first coaxial connector is mounted in the input port. A second coaxial connector is mounted in the output port. A third coaxial connector is mounted in the power port. A power amplifier is mounted within the housing, and is used to amplify an input signal received through the first coaxial connector. At least a portion of the housing has at least one metal plated thereon. The first aluminum housing piece is soldered, welded or brazed to the second housing piece.

In some embodiments, the first, second and third coaxial connectors may each be a female F-style coaxial connector having brass connector housings. The housing may comprise an aluminum housing body and a back plate. The metal plating may comprise copper that is flash coated onto the housing. In some embodiments, a nickel-based layer, a tin-based layer and/or a nickel and tin alloy based layer may be plated on the copper flash coat. The first aluminum housing piece may be mounted directly to the second housing piece without an intervening gasket. The first housing piece may be soldered, or welded or otherwise permanently adhered to the second housing piece. In embodiments that use solder, a non-lead or lead-based solder may be used to solder the first housing piece to the second housing piece.

Pursuant to further embodiments of the present invention, methods of manufacturing a signal amplifier are provided. Pursuant to these methods, a housing body having a bottom and sidewalls that define a compartment is formed via an aluminum casting process. A back plate is also formed. The back plate may comprise, for example, an aluminum, brass, iron or steel back plate. At least a portion of the housing body is plated with copper. At least a portion of the back plate is likewise plated with copper. At least one metal or metal alloy is plated on the copper plating on the housing body. At least one metal or metal alloy is plated on the copper plating on the back plate. At least one input connector, at least one output connector and at least one power connector are installed in the housing body. The signal amplifier is installed within the housing body. Finally, the back plate is soldered to the housing body.

In some embodiments, the input, output and power connectors may be coaxial connectors having a brass connector housing. The metal or metal alloy that is plated on the copper plating on the housing body and/or back plate may be nickel and/or tin. The back plate may be soldered to a lip that is formed in an interior surface of the sidewalls so as to extend around substantially the entire periphery of the housing body. Moreover, the back plate may be mounted directly to the housing body without any intervening gasket. The back plate may be soldered to the housing body using a lead-based or a non-lead-based solder.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "mounted" to another element, it can be directly connected or coupled to the other element or intervening elements may be present. In contrast, when an element is referred to as being "directly connected" or "directly mounted" to another element, there are no intervening elements present. Other words used to describe the relationship between elements should be interpreted in a like fashion (i.e., "between" versus "directly between", etc.).

In accordance with embodiments of the present invention, signal amplifiers are provided that have a multi-piece metal-plated aluminum housing. The plated-aluminum housing pieces are soldered together to provide a weather-proof housing structure. In some embodiments, no weather gaskets or RFI gaskets are required. As discussed herein, the signal amplifiers according to embodiments of the present invention may be lightweight, extremely durable, and less expensive than comparable prior art signal amplifiers. Moreover, the signal amplifiers according to embodiments of the present invention may exhibit improved electrical performance and/or may have improved thermal conductivity. The aluminum housing may comprise a pure aluminum housing or an aluminum alloy housing such as 360 aluminum.

Figure 1:
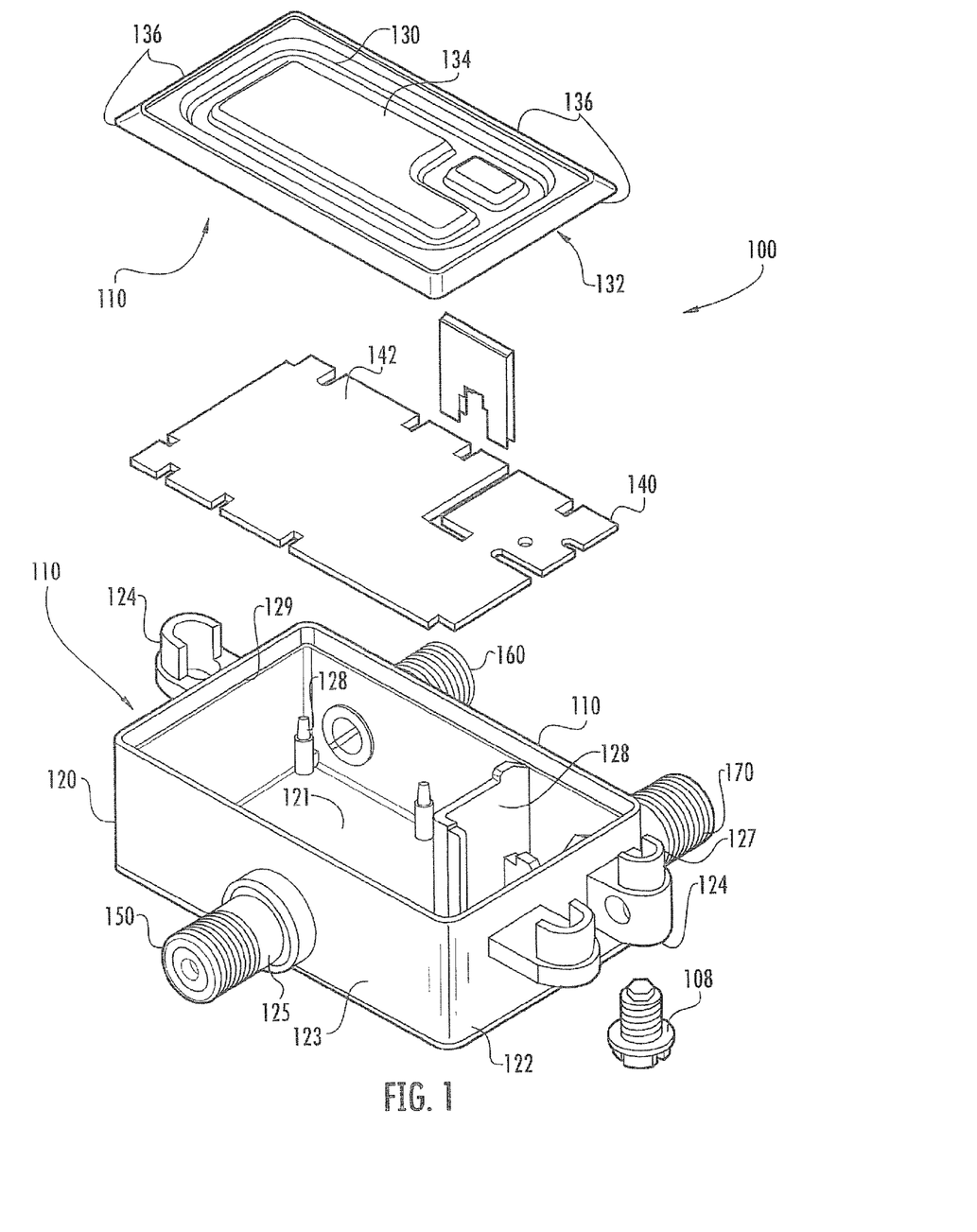
FIG. 1 is an exploded bottom perspective view of a signal amplifier having a multi-piece metal-plated aluminum housing according to embodiments of the present invention.
Figure 2:
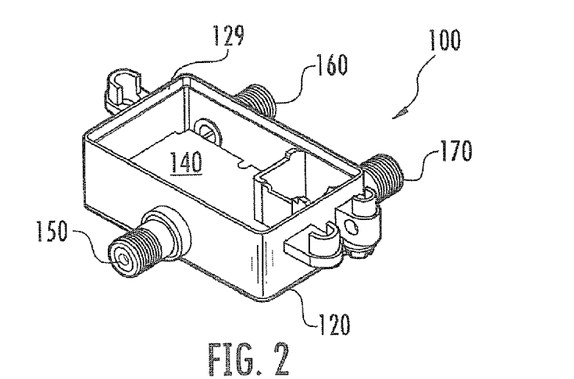
FIG. 2 is a bottom perspective view of the housing body of the signal amplifier of FIG. 1 with the printed circuit board of the signal amplifier mounted therein.
Figure 3:
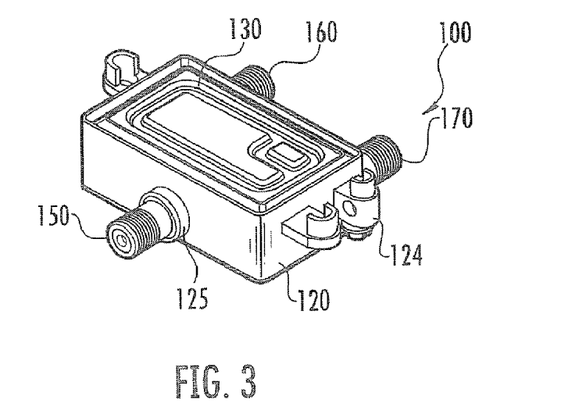
FIG. 3 is a bottom perspective view of the signal amplifier of FIG. 1 after the back plate has been installed on the housing body.
Figure 4:
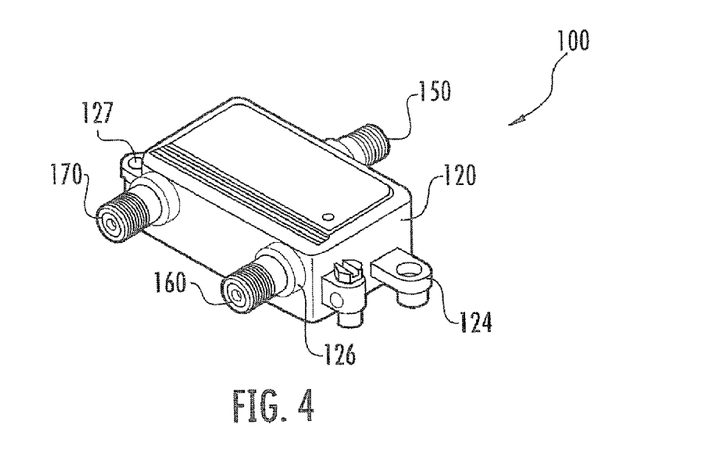
FIG. 4 is a top perspective view of the signal amplifier of FIG. 1.

FIGS. 1-4 illustrate a radio frequency ("RF") signal amplifier 100 according to certain embodiments of the present invention that includes a multi-piece metal-plated aluminum housing. In particular, FIG. 1 is an exploded bottom perspective view of the signal amplifier 100, while FIG. 2 is a bottom perspective view of the housing body of the signal amplifier 100. FIG. 3 is a bottom perspective view of the signal amplifier 100 after the back plate has been installed on the housing body. Finally, FIG. 4 is a top perspective view of the signal amplifier 100.

As shown in FIGS. 1-4, the signal amplifier 100 includes a housing 110, internal circuitry 140, an input connector 150, an output connector 160 and a power connector 170. The housing 110 comprises a housing body 120 and a back plate 130. The housing body 120 may comprise, for example, a generally rectangular aluminum box having a bottom 121, lateral sidewalls 122, longitudinal sidewalls 123 and an open top. A plurality of flanges 124 may extend from one or more of the sidewalls 122, 123 that may be used to mount the signal amplifier 100 to, for example, a wall or other surface. In the depicted embodiment, a total of three flanges 124 are provided on the lateral sidewalls 122. In the particular embodiment illustrated in FIGS. 1-4, each of the flanges 124 includes an aperture that may receive, for example, a screw or nail (not shown) that is used to mount the signal amplifier 100 to a wall or other surface. A grounding screw 108 is provided that may be used to earth ground the signal amplifier 100.

As is also shown in FIGS. 1-4, the housing body 120 also includes an input connector port 125, an output connector port 126 and a power connector port 127. While a single output connector port 126 is shown, it will be appreciated that different numbers of output connector ports 126 may be provided. Each of the connector ports 125, 126, 127 may comprise a hollow, metal cylinder that extends from one of the longitudinal sidewalls 123 of the housing body 120. The connector ports 125, 126, 127 may each surround a circular opening in the longitudinal sidewalls 123. The particular design of the connector ports 125, 126, 127 may vary, although each connector port 125, 126 will be configured to receive a communications connector. The ports 125, 126, 127 may comprise an integral part of the plated-aluminum housing body 120. In fact, in some embodiments the housing body 120 may be cast as a single, unitary piece from a mold that includes the connector ports 125, 126, 127. Typically, the housing body 120 will be formed by a casting operation.

The housing body 120 may include a plurality of internal support structures 128 that may be used to support the internal circuitry 140 and/or to facilitate making electrical connections between the internal circuitry 140 and the input connector 150 and/or the output connector 160. The internal support structures 128 may also act as heat sinks that transfer heat away from active components of the internal circuitry 140. The inner, top portions of the longitudinal and lateral sidewalls 122, 123 may be thinned to create an internal lip 129 that extends around the internal periphery of the housing body 120. As discussed below, the back plate 130 may rest on and be soldered to this internal lip 129.

As shown best in the exploded perspective view of FIG. 1, the internal circuitry 140 is mounted on the support structures 128 within the housing body 120. In order to simplify the drawings, in FIG. 1 the internal circuitry 140 is depicted simply as a printed circuit board 142. Typically, the internal circuitry 140 will comprise active and/or passive components such as directional couplers, relays, RF splitters, diplexers, power amplifiers, resistors, capacitors, inductors and the like, which are typically mounted on the printed circuit board 142. The printed circuit board 142 may be soldered in place inside the housing body 120. Electrical connections (not shown in the figures) are provided that electrically connect the input, output and power connectors 150, 160, 170 to the circuitry on the printed circuit board 142.

The internal circuitry 140 may comprise any circuit components that are used to implement the functionality of a signal amplifier such as, for example, a signal amplifier that is used to amplify signals transmitted over a cable television network. U.S. patent application Ser. No. 12/208,675, filed Sep. 11, 2008 and now published as U.S. Patent Publication No. 2009/0047917, the contents of which are incorporated herein by reference, illustrates the designs for a number of signal amplifiers that could be incorporated into housings according to embodiments of the present invention. It will be appreciated, however, that the present invention may be used with any signal amplifier such as, for example, signal amplifiers that do not include dedicated Voice over IP bypass paths, signal amplifiers that do not include a power amplifier in the forward and/or return path, signal amplifiers with different numbers of input and/or output ports, amplifiers with different circuit designs (e.g., signal amplifiers that support MOCA), etc.

The input connector 150 may comprise, for example, a female F-style coaxial connector. Thus, for example, in some embodiments, the input connector 150 may have the design shown in U.S. Pat. No. 6,299,479, the contents of which are incorporated herein by reference as if set forth fully herein. The output and power connectors 160, 170 may also each comprise a female F-style coaxial connectors and may be identical to the input connector 150. The input, output and power connectors 150, 160, 170 are mounted within their respective input and output ports 125, 126, 127. In some embodiments, the power connector 170 may be used solely to provide a direct current ("DC") power signal to the signal amplifier 100. In other embodiments, the power connector 170 may comprise a dual radio frequency/DC power port. In such embodiments, the power connector 170 may serve as both a power input and, for example, as a second output connector 160.

As shown best in FIGS. 1 and 3, the back plate 130 comprises a generally planar metal plate having a top side 132, a bottom side 134 and side edges 136. The back plate 130 may be sized to just fit within the open top of the housing body 120. The back plate 130 may be completely planar, but need not be. For example, as shown in FIGS. 1-4, the back plate 130 may have grooves, indentations and the like that, for example, facilitate holding the internal circuitry 140 firmly in place inside the housing body 120. The periphery of the back plate 130 may be sized so that the back plate is small enough to fit within the open top of the housing body 120, but is large enough so that the exterior side edges 136 of the back plate 130 will rest on the lip 129 in the sidewalls 122, 123 of the housing body 120. The back plate 130 may be formed, for example, by casting or by a stamping operation.

As noted above, the housing body 120 and the back plate 130 may be formed of aluminum. However, as known to those of skill in the art, aluminum generally cannot be soldered. Thus, as discussed above with respect to FIGS. 7-10, in conventional signal amplifiers having aluminum housings, the back plate is mounted to the housing body using locking screws, and a weather gasket and an RFI gasket are provided between the housing components to provide environmental and RFI protection. According to embodiments of the present invention, at least portions of the housing body 120 and the back plate 130 may be subjected to a metal-plating process to provide a metal-plated aluminum housing body 120 and a metal-plated aluminum (or other metal) back plate 130 that can be soldered together. Herein, the term "aluminum" encompasses both pure aluminum as well as aluminum alloys. In some embodiments, the back plate 130 may comprise a conductive material other than aluminum that can be readily plated with a metal or metal alloy that can be soldered or welded to the housing body 120. For example, in some embodiments, a metal-plated steel back plate 130 may be used.

Figure 5:
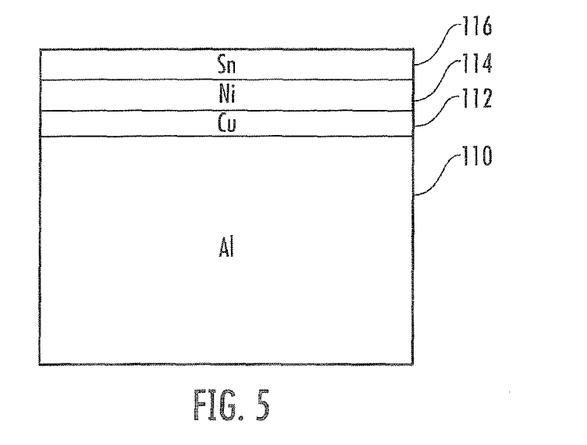
FIG. 5 is a schematic cross-sectional diagram illustrating the metal layers that may be plated onto the aluminum housing pieces according to embodiments of the present invention.

FIG. 5 is a schematic cross-sectional diagram of a portion a metal-plated aluminum housing piece according to embodiments of the present invention. Referring to FIG. 5, it can be seen that pursuant to some embodiments of the present invention, the metal-plating process may include plating a flash coat 112 of copper directly onto at least the portions of the housing 110 (i.e., the housing body 120 and the back plate 130) that are to be soldered together. In the embodiment depicted in FIGS. 1-4, this would include the area of the housing body 120 around the lip 129 and the side edges 136 and/or the periphery of the top 132 of the back plate 130. The copper flash coat 112 may be a very thin coat of copper ("Cu") that may or may not completely cover the portions of the aluminum housing 110 to which the flash coat 112 is applied. The copper flash coat 112 may fill in pores in the surface of the aluminum housing pieces 120, 130. The copper flash coat 112 may improve the conductivity of the aluminum housing 110, which may facilitate improved heat transfer during the soldering process that may provide for a better solder joint. The copper flash coat 112 may be applied, for example, using electro copper plating techniques.

Figure 6:
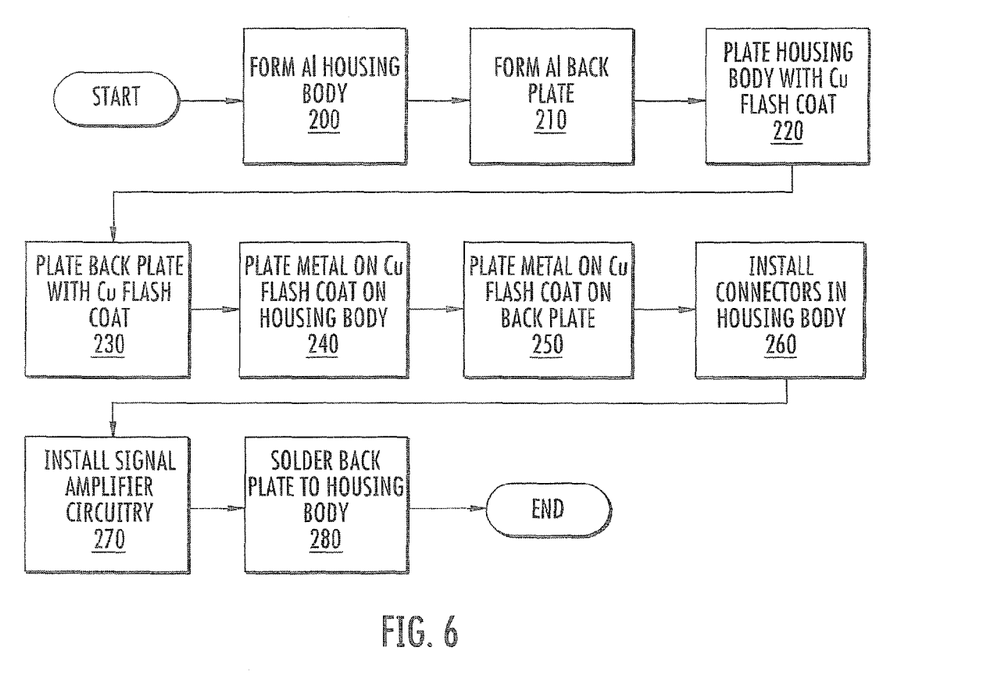
FIG. 6 is a flow chart illustrating methods of manufacturing signal amplifiers according to embodiments of the present invention.

FIG. 6 is a flow chart illustrating methods of manufacturing signal amplifiers according to embodiments of the present invention. As shown in FIG. 6, pursuant to these methods, a housing body having a bottom and sidewalls that define a compartment is formed via an aluminum casting process (block 200). It will be appreciated that the housing body need not be generally square or rectangular, but mat comprise any shape that provides a compartment that can hold the signal amplifier circuitry. Thus, for example, the housing body could be bowl shaped (e.g., a circular bowl, an oval bowl, etc.), with the bowl having, for example, semi-circular "sidewalls" and a bottom. Regardless of the shape of the housing body, one or more of the sidewalls may be cast to have connector ports therein. An aluminum (or steel) back plate is also formed using, for example, a stamping process (block 210). At least a portion of the housing body is plated with copper to form a copper flash coat on the housing body (block 220). Similarly, at least a portion of the back plate is plated with copper to form a copper flash coat thereon (block 230). At least one metal or metal alloy is then plated onto the copper plating on the housing body (block 240). At least one metal or metal alloy is likewise plated onto the copper plating on the back plate (block 250). At least one input connector, at least one output connector and at least one power connector are then installed in the housing body (block 260). The signal amplifier is installed within the housing body (block 270). Finally, the back plate is soldered to the housing body (block 280).

Nickel ("Ni") and/or tin ("Sn") may then be plated on top of the copper flash coat 112. In some embodiments, a nickel layer 114 may be plated onto the copper flash coat 112, and then a tin layer 116 is plated on top of the nickel plating 114. As is known to those of skill in the art, solder has good adhesion characteristics to both nickel and tin; thus, the plated nickel and tin layers 114, 116 allow the back plate 130 to be soldered to the housing body 120. The nickel plating may be applied, for example, using nickel electroplating techniques.

If the copper flash coat 112 is not applied, the nickel plating 114 may be applied using electroless nickel ("EN") plating techniques.

As the back plate 130 may be soldered to the housing body 120, the overall size of the housing 110 may be reduced as compared to conventional aluminum signal amplifier housings, as the interior of conventional aluminum housings include a number of locking screws (e.g., four) about the internal periphery of the housing that increase the overall footprint of the housing (see FIGS. 7-10). Additionally, as the solder may provide a robust, weather-proof seal, the weather gasket that is typically included within a conventional aluminum signal amplifier housing may be omitted, and the RFI gasket may be eliminated as well due to the higher conductivity of the housings according to embodiments of the present invention. The soldered housing may also provide a superior electromagnetic interference ("EMI") shield as compared to conventional aluminum signal amplifier housings that are assembled using locking screws.

It will be appreciated that the back plate may be permanently adhered to the housing body by welding or brazing in addition to by soldering.

In one specific embodiment of the present invention, the housing body 120 may comprise an aluminum housing body (e.g., a 360 aluminum alloy), and the back plate 130 may comprise a brass back plate. An electroless nickel plating may be applied to the aluminum housing body 120, and a copper flash coat may be plated on the brass back plate 130, followed by a nickel plating. A liquid paint coat may be applied to the exterior of the housing body 120 as well.

In other specific embodiments of the present invention, the housing body 120 may comprise an aluminum housing body, and the back plate 130 may comprise one of an aluminum, iron or steel back plate. An electroless nickel plating may be applied to the aluminum housing body 120, and a copper flash coat may be plated on the back plate 130, followed by a nickel plating. A liquid paint coat may be applied to the exterior of the housing body 120 as well.

In further embodiments of the present invention, the housing body 120 may comprise an aluminum housing body, and the back plate 130 may comprise one of an aluminum, iron, brass or steel back plate. A copper flash coat may be plated on the housing body 120, followed by a nickel plating. A copper flash coat may be plated on the back plate 130, followed by a nickel plating. A liquid paint coat or an electrostatic powder coat may be applied to the exterior of the housing body 120. A lacquer coat may be applied to the exterior of the back plate 130.

In still further embodiments of the present invention, the housing body 120 may comprise an aluminum housing body, and the back plate 130 may comprise one of an aluminum, iron, brass or steel back plate. A copper flash coat may be plated on the housing body 120, followed by a nickel plating, followed by a bright tin or tin plating. A copper flash coat may be plated on the back plate 130, followed by a nickel plating, followed by a bright tin or tin plating. A liquid paint coat or an electrostatic powder coat may be applied to the exterior of the housing body 120. A lacquer coat may be applied to the exterior of the back plate 130.

In additional embodiments of the present invention, the housing body 120 may comprise an aluminum housing body, and the back plate 130 may comprise one of an aluminum, iron, brass or steel back plate. A copper flash coat may be plated on the housing body 120, followed by a nickel-tin alloy plating. A copper flash coat may be plated on the back plate 130, followed by a nickel-tin alloy plating.

In yet additional embodiments of the present invention, the housing body 120 may comprise an aluminum housing body, and the back plate 130 may comprise one of an aluminum, iron, brass or steel back plate. A copper flash coat may be plated on the housing body 120, followed by a nickel plating, followed by a bright tin or tin plating. A copper flash coat may be plated on the back plate 130, followed by a nickel plating, followed by a bright tin or tin plating. A liquid paint coat or an electrostatic powder coat may be applied to the exterior of the housing body 120. A liquid paint coat or a powder coat may be applied to the exterior of the back plate 130.

While signal amplifiers that include multi-piece zinc ("Zn") housings that are soldered together are known in the art, zinc may have a number of disadvantages as compared to the plated-aluminum housings according to embodiments of the present invention. First, aluminum is more electrically conductive than zinc. As such, an aluminum housing may provide a better ground surface than a comparable zinc housing. Second, aluminum has better thermal conductivity than zinc. As noted above, better thermal conductivity can result in better solder joints. Additionally, aluminum housings can equally and/or better dissipate heat generated by the signal amplifier during operation, and hence can provide improved amplifier performance as the performance of a signal amplifier may tend to degrade at elevated temperatures. For example, the thermal conduction of aluminum is typically in the range 160-180 W/(m·0 C), whereas the thermal conduction of zinc is about 113 W/(m·0 C). While aluminum alloys typically have lower thermal conductivity numbers, the same is also true for zinc alloys. Third, while aluminum and zinc typically cost about the same per pound (the five year average in spot price between the two is within five percent), zinc weighs approximately 2.5 times more than aluminum. As the thickness of the housing body 120 and back plate 130 will typically be approximately the same regardless of the metal used to form the housing, an aluminum signal amplifier housing may require substantially less metal (by weight) than a corresponding zinc housing. Consequently, the material costs of a plated-aluminum housing may be substantially less than the material costs of a plated-zinc housing. Moreover, the resulting product is also lighter, which may reduce transportation costs and lighter products may be preferred by installers.

Additionally, most coaxial connectors used in cable television systems including, for example, the F-style coaxial connectors depicted in FIGS. 1-4 above, have brass connector housings. However, corrosion can occur due to electrolytic action between dissimilar metals, and the degree to which such corrosion may occur between zinc and brass may be nearly twice as high as the degree to which such corrosion may occur between aluminum and brass. Moreover, zinc is a relatively soft metal; hence, if a male F-style coaxial connector is mated to a brass female coaxial connector that is mounted in a zinc connector port, the torque applied to the female connector during the mating operation can cause the female connector to damage the threads that are used to hold the connector in place within the zinc connector port. Consequently, if brass connectors were used in signal amplifiers having plated-zinc housings, the connectors would be subject to corrosion and/or damage. Thus, housing casted zinc connectors are used in signal amplifiers that include plated-zinc housings. In contrast, the signal amplifiers with soldered, plated-aluminum housings according to embodiments of the present invention may use brass input and output connectors with significantly lower susceptibility to damage and/or corrosion.

The foregoing disclosure is not intended to limit the present invention to the precise forms or particular fields of use disclosed. It is contemplated that various alternate embodiments and/or modifications to the present invention, whether explicitly described or implied herein, are possible in light of the disclosure.

That which is claimed is:

1. A signal amplifier, comprising
    a housing that includes a first aluminum housing piece and a second housing piece, the housing including an input port, an output port and a power port;
    a first coaxial connector mounted in the input port;
    a second coaxial connector mounted in the output port;
    a third coaxial connector mounted in the power port;
    a power amplifier mounted within the housing that is configured to amplify an input signal received through the first coaxial connector;
    wherein at least a portion of the first aluminum housing piece and at least a portion of the second housing piece have at least one metal plated thereon, and
    wherein the first aluminum housing piece is permanently attached to the second housing piece by soldering, welding or brazing,
    wherein the at least one metal plated on the housing comprises copper that is flash coated onto the first and second housing pieces.

2. The signal amplifier of claim 1, wherein the first, second and third coaxial connectors each comprise female F-style coaxial connectors having brass connector housings.

3. The signal amplifier of claim 1, wherein the second housing piece comprises an aluminum back plate.

4. The signal amplifier of claim 1, wherein the second housing piece comprises a steel back plate.

5. The signal amplifier of claim 1, wherein the second housing piece comprises a brass back plate.

6. The signal amplifier of claim 1, wherein the at least one metal plated on the housing further comprises a nickel-based layer that is plated on the copper flash coat.

7. The signal amplifier of claim 1, wherein the at least one metal plated on the housing further comprises a tin-based layer that is plated on the copper flash coat.

8. The signal amplifier of claim 1, wherein the at least one metal plated on the housing further comprises a nickel-based plating layer and a tin-based plating layer that are plated on the copper flash coat.

9. The signal amplifier of claim 1, wherein the at least one metal plated on the housing further comprises a nickel-tin-based alloy plating layer that is plated on the copper flash coat.

10. The signal amplifier of claim 1, wherein the first aluminum housing piece comprises a housing body and the second housing piece comprises an aluminum back plate, and wherein the housing body is mounted directly to the back plate without an intervening gasket.

11. The signal amplifier of claim 1, wherein the first aluminum housing piece is permanently attached to the second housing piece by soldering, and wherein the solder used to solder the first aluminum housing piece to the second housing piece comprises a lead-based solder.

12. The signal amplifier of claim 1, wherein the first aluminum housing piece is permanently attached to the second housing piece by soldering, and wherein the solder used to solder the first aluminum housing piece to the second housing piece comprises a non-lead-based solder.

13. The signal amplifier of claim 1, wherein the portions of the first housing piece and the second housing piece that are soldered together comprise portions of the first and second housing pieces that have the least one metal plated thereon.

14. A signal amplifier, comprising
    a housing that includes a first aluminum housing piece and a second housing piece, the housing including an input port, an output port and a power port;
    a first coaxial connector mounted in the input port;
    a second coaxial connector mounted in the output port;
    a third coaxial connector mounted in the power port;
    a power amplifier mounted within the housing that is configured to amplify an input signal received through the first coaxial connector;
    wherein at least a portion of the first aluminum housing piece and at least a portion of the second housing piece have at least one metal plated thereon, and
    wherein the first aluminum housing piece is permanently attached to the second housing piece by soldering, welding or brazing,
    wherein the at least one metal plated on the housing comprises electroless nickel that is coated onto the first and second housing pieces.

15. The signal amplifier of claim 14, wherein the at least one metal plated on the housing further comprises a tin-based layer that is plated on the electroless nickel coat.

16. The signal amplifier of claim 14, wherein the at least one metal plated on the housing further comprises a nickel-tin-based alloy plating layer that is plated on the electroless nickel coat.

* * * * *